US00RE38114E

(19) United States
(12) Reissued Patent
Souders et al.

(10) Patent Number: US RE38,114 E
(45) Date of Reissued Patent: May 6, 2003

(54) NON-STICK PHOTORESIST LAMINATE

(75) Inventors: Roger Souders, Vista, CA (US); Randy S. Willis, Vista, CA (US)

(73) Assignee: Rayzist Photomask, Inc., Vista, CA (US)

(21) Appl. No.: 10/067,739

(22) Filed: Feb. 8, 2002

Related U.S. Patent Documents

Reissue of:
(64) Patent No.: 6,235,449
Issued: May 22, 2001
Appl. No.: 09/440,642
Filed: Nov. 16, 1999

(51) Int. Cl.[7] ..... G03C 1/76
(52) U.S. Cl. ..... 430/273.1; 430/271.1
(58) Field of Search ..... 430/273.1, 271.1

(56) References Cited

U.S. PATENT DOCUMENTS

| | | | | | |
|---|---|---|---|---|---|
| 4,499,178 | A | * | 2/1985 | Wada et al. | 430/271.1 |
| 4,692,373 | A | * | 9/1987 | Welz et al. | 428/285 |
| 4,764,449 | A | * | 8/1988 | Vanlseghem | 430/271.1 |
| 4,855,142 | A | * | 8/1989 | Frankhauser et al. | 424/434 |
| 5,055,377 | A | * | 10/1991 | Littmann et al. | 430/271.1 |
| 5,110,390 | A | * | 5/1992 | Martini et al. | 156/244.11 |
| 5,366,584 | A | * | 11/1994 | Zukowski et al. | 430/308 |
| 5,368,982 | A | * | 11/1994 | Suzuki et al. | 430/256 |
| 5,370,762 | A | * | 12/1994 | Zukowski et al. | 430/255 |
| 5,415,971 | A | * | 5/1995 | Couture et al. | 430/273.1 |
| 5,427,890 | A | * | 6/1995 | Suzuki et al. | 430/271.1 |
| 6,027,871 | A | * | 2/2000 | Katoh | 430/619 |

OTHER PUBLICATIONS

Air Products and Chemicals, Inc. brochure 151–9442R, 1995.*

* cited by examiner

*Primary Examiner*—Janet Baxter
*Assistant Examiner*—Sin J. Lee
(74) *Attorney, Agent, or Firm*—Nixon & Vanderhye P.C.

(57) ABSTRACT

A photoresist laminate includes a substrate (such as PET film having a thickness of between about 0.002–0.003 inches) with first and second faces, a first film layer, and a second layer. The first film layer is a photoresist material (radiation sensitive) which is soluble or dispersible in water but which will harden upon sufficient exposure to radiation so as to become substantially insoluble or non-dispersible. The first film layer may be of any conventional photoresist material (e.g. having a thickness of about 0.002–0.009 inches) and is operatively disposed on the substrate first face (either directly connecting it or connected to a membrane support layer which in turn is directly connected to the substrate first face). The second layer is of a material and thickness so that it substantially prevents sticking of the first film layer to other surfaces, while not significantly interfering with the radiation sensitivity thereof. The second layer is on the opposite side of the first film layer from the substrate, and may comprise a mixture of polyvinyl alcohol solution and polyvinyl acetate emulsion, having a thickness of less than 0.0005 inches (e.g. about 0.0001–0.0002 inches). The laminate is used in a method of making a stencil for abrading or etching by exposing the laminate to radiation, processing a laminate by spraying water on the laminate to remove the soluble or dispersible portion, and then using the stencil so formed as a mask on the surface of an object to etch or abrade the surface.

4 Claims, 1 Drawing Sheet

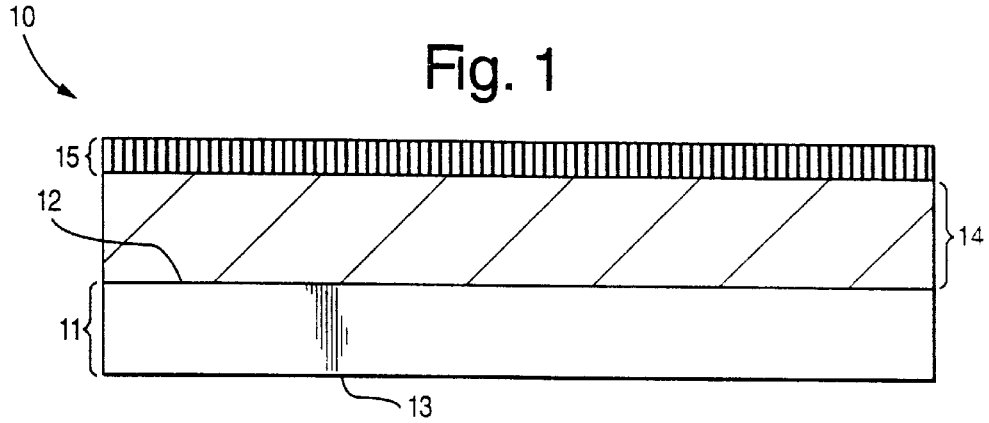
Fig. 1
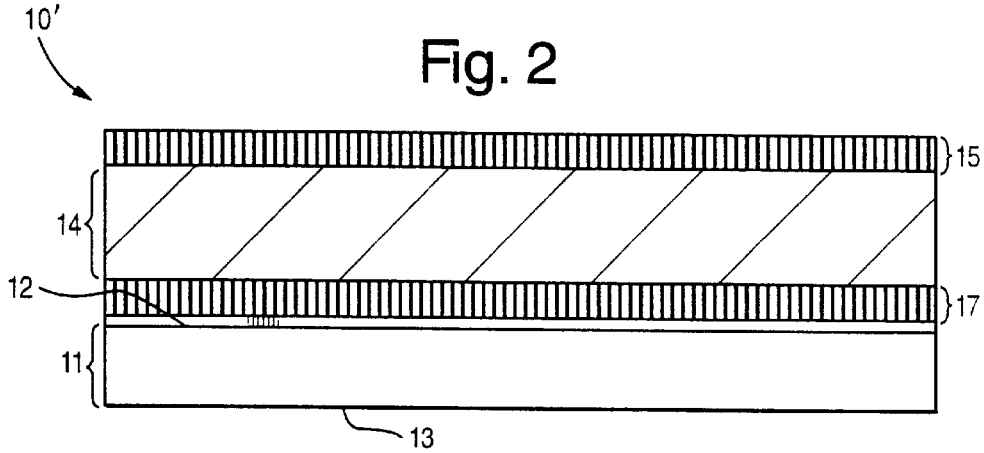
Fig. 2
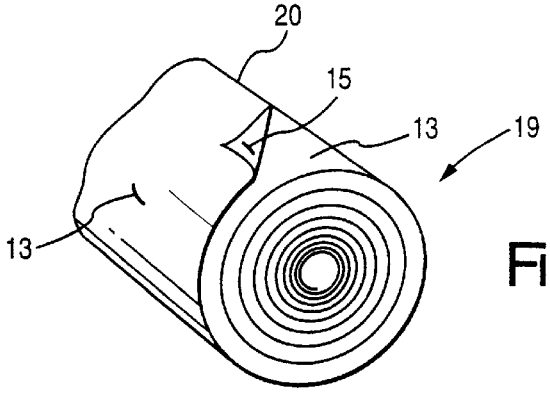
Fig. 3
Fig. 4
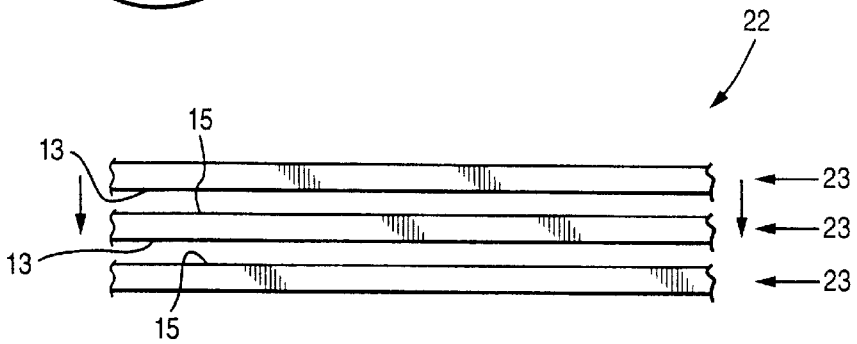

NON-STICK PHOTORESIST LAMINATE

Matter enclosed in heavy brackets [ ] appears in the original patent but forms no part of this reissue specification; matter printed in italics indicates the additions made by reissue.

BACKGROUND AND SUMMARY OF THE INVENTION

Products that have decorative patterns formed on the surface of the products by abrasion (typically sandblasting) or etching are becoming increasingly more popular. A wide variety of techniques have been developed to effectively produce masks to facilitate accurate production of such objects, such as shown in U.S. Pat. Nos. 5,370,762, 4,764,449, and 5,427,890 (the disclosures of which are hereby incorporated by reference herein), and various automated equipment has been developed to facilitate processing during production of such masks (such as shown in U.S. Pat. No. 5,366,584). The basic processes utilize a photoresist laminate which may have a variety of constructions, but includes a substrate and an outer layer of photoresist material (radiation sensitive material which is soluble or dispersible in water but will harden upon sufficient exposure to radiation so as to become substantially insoluble or non-dispersible) facing outwardly from the substrate. The photoresist laminate is typically provided in roll form where the radiation sensitive material of one part of the roll contacts a substrate on another part of the roll; or the laminate may be provided in sheet form with one sheet stacked upon another with the radiation sensitive material of one sheet contacting the substrate of another. Under some circumstances, especially where there is high humidity or products have been maintained in a roll or stacked configuration for a long period of time, a problem of sticking may occur. That is, the photoresist material sticks to the substrate of an engaged part of the roll, or of another sheet. This can be a significant problem since sticking may cause the photoresist material to be removed or separated from the substrate, and make it unusable for its intended purpose.

Another problem can occur when the photoresist is exposed to UV radiation. The pattern that creates the latent image is printed on a paper vellum or plastic film. This pattern is pressed onto the surface of the photoresist during its exposure to radiation. A sticky photoresist material can cause paper vellums to tear or pull off the ink that creates the pattern. The sticking can also cause delamination between the photoresist and the substrate film when the vellum is removed.

In order to overcome this problem, various types of substrates have been attempted to be utilized, with less than optimum success in preventing or minimizing the sticking problem. Also providing a release liner on top of the radiation sensitive material (photoresist material) which is removed prior to use significantly increases the costs of the laminate, makes the laminate bulkier to ship, and introduces another step for the utilization thereof.

According to the present invention a photoresist laminate, a stencil made therefrom and a method of utilization thereof for abrading or etching, are provided which substantially eliminate or minimize the sticking problem in a simple and effective manner, without significantly increasing the cost of the laminate, and without introducing another step for utilization thereof. According to the present invention, during manufacture the radiation sensitive material is provided with a very thin coating which is readily removed during processing, and does not significantly interfere with the radiation sensitivity of the photoresist material, yet it substantially prevents sticking of the photoresist material to a substrate of an adjacent portion of the laminate in a roll, or of another sheet in the stack, or even to other materials that the photoresist material may inadvertently come into contact with.

According to one aspect of the present invention a photoresist resist laminate is provided comprising the following components: A substrate having first and second faces. A first film layer of radiation sensitive material which is soluble or dispersible in water but will harden upon sufficient exposure to radiation so as to become substantially insoluble of non-dispersible, and operatively disposed on the substrate first face. And a second layer of a material and thickness so that it substantially prevents or minimizes sticking of the first film layer while not significantly interfering with the radiation sensitivity thereof. The second layer is on the opposite side of the first film layer from the substrate.

The photoresist laminate may comprise other layers and constructions. For example, a membrane support layer may be provided between the substrate and the first film layer and engaging both the substrate and the first film layer. Also, or alternatively, the first film layer may comprise two clearly different colored portions, one atop the other, specifically as described in said copending application Ser. No. 09/137,702; and the laminate may consist of the recited elements above.

Typically, the second layer has a maximum thickness of about 0.0005 inches, e.g. about 0.0003 inches, and most desirably between 0.0001–0.0002 inches. While any material suitable for performing the non-stick, yet not interfering with the radiation sensitivity, functions may be provided, one particularly desirable material for forming the second film layer comprises a mixture of polyvinyl alcohol solution and polyvinyl acetate emulsion. The range may be 2–98% by weight of one and 98–2% of the other. If a water soluble formula is desired so as to facilitate wash-away of the second layer during processing, preferably about 80%–98% by weight polyvinyl alcohol solution with the remainder polyvinyl acetate solution (and perhaps some inert materials is provided). If a substantially water insoluble formulation is desired it comprises about 80–98% by weight polyvinyl acetate solution with the remainder polyvinyl alcohol solution (and perhaps inert ingredients).

The second layer may he applied in a conventional coating process (e.g. direct roll coating) after the rest of the laminate has been formed, or may be provided by spraying a fine spray of the second layer material on the first layer, to form a fine film, using conventional aerosol equipment.

A variety of thicknesses and materials may be utilized. For example the first film layer may have a thickness of between about 0.002–0.009 inches may be a conventional photoresist material such as described in said copending application Ser. No. 09/137,702, or a positive or a negative acting film such as described in U.S. Pat. No. 4,764,449, or of any other conventional construction such as shown in U.S. Pat. No. 5,427,890. The substrate typically has a thickness of about 0.002–0.003 inches and may comprise PET film, or Mylar® polyester film (e.g. type S-200 gauge), or any other conventional substrate. The membrane support layer, when utilized, may have a thickness of between 3–5 microns and also may comprise any suitable conventional material. Other layers are also possible depending upon the particular use or circumstances, again such as described in U.S. Pat. No. 4,764,449.

The laminate may be in a roll form with the second layer contacting the second face of the substrate in a substantially non-stick manner. Alternatively, the laminate may be in sheet form, and stacked with other substantially identical laminates so that the second layer of one sheet engages the second face of the substrate of another sheet.

The laminate as described above preferably is utilized in a method of making a stencil and ultimately an etched or abraded object, such as described in either the inventive or background portions of copending application Ser. No. 09/173,702. For example, by utilizing the laminate as described above a method of making a stencil for abrading or etching using a negative acting or positive acting photoresist laminate as described above, is provided comprising: (a) Exposing the laminate and a pattern to radiation to cause hardening of some portions to define the pattern as a latent image in the photoresist first film layer by providing some portions that are soluble or dispersible in water, and other portions that are substantially insoluble or non-dispersible (b) Processing the laminate from (a) by spraying water on the laminate to remove the soluble or dispersible portions of the first layer, and at least those portions of the second layer covering the soluble or dispersible portions of the first layer, but not the substantially insoluble or non-dispersible patterns of the first layer to ultimately produce a stencil. And (c) using the stencil from (b) as a mask on the surface of an object to etch or abrade the surface of the object where the photoresist film has been removed to form a surface texture in the object that stimulates the latent image.

Where the first layer comprises first and second clearly different colored portions, one atop of the other, then (b) is practiced to first remove substantially all of the soluble or dispersible portions of the first color, and only then to carefully start to remove the soluble or dispersible portions of the second color. The invention also relates to a stencil produced by practicing (a) and (b) of the method as described above.

It is the primary object of the present invention to provide a photoresist laminate which substantially eliminates or minimizes the sticking problem present in conventional photoresist laminates, in a simple and cost effective manner, which does not require changes in the method of utilization thereof to produce a stencil for masking and ultimately producing an etched or abraded object. This and other objects of the invention will become clear from an inspection of the detailed description of the invention and from the appended claims.

BRIEF DESCRIPTION OF THE DRAWINGS

FIG. 1 is a side enlarged cross sectional view, with the relative thicknesses of the components exaggerated for clarity of illustration, of one embodiment of a photoresist laminate according to the present invention;

FIG. 2 is a view like that of FIG. 1 for another embodiment of a laminate according to the present invention;

FIG. 3 is a schematic perspective view of the laminate of the FIGS. 1 and 2 in a roll configuration; and FIG. 4 is a schematic side exploded view of the laminate of FIGS. 1 and 2 during stacking, wherein one sheet of laminate will be brought into contact with another in a stack.

DETAILED DESCRIPTION OF THE DRAWINGS

One embodiment of an exemplary photoresist laminate provided according to the present invention is illustrated generally at 10 in FIG. 1. It includes a substrate 11 having a first face 12 and a second face 13. The substrate (also often referred to as a support carrier) 11 may be of any suitable material and any suitable thickness. For example, the substrate 11 may comprise PET film of a thickness of between about 0.002–0.003 inches. Other materials that may be utilized include BOPP, and Mylar® polyester film (such as type S-200 gauge available from du Pont) with either a clear unmatted surface or a matte surface, etc.

The laminate 10 further comprises a first film layer 14. The layer 14 may comprise a plurality of layers made by coating first one layer and then another, or may comprise a single layer. Regardless of how the film layer 14 is constructed, it preferably typically has a thickness of between about 0.002–0.009 inches, and is a photoresist material, that is, it is a radiation sensitive (either positive or negative acting) material which is soluble or dispersible in water but will harden upon sufficient exposure to radiation (e.g. UV) so as to become substantially insoluble or non-dispersible. The first film layer 14 is provided so that it is operatively disposed on the first face 12 of the substrate 11. By "operatively disposed" is meant that either the first film layer 14 actually contacts and is adhered to the first face 12, or there are one or more intermediate layers which provide effective attachment of the first film layer 14 to the first face 12. The radiation sensitive material forming the first film layer 14 may comprise any suitable conventional material which performs a function such as disclosed in U.S. application Ser. No. 09/137,702, U.S. Pat. No. 4,674,449, or U.S. Pat. No. 5,427,890.

According to the invention, the laminate 10 also comprises a second layer 15 of a material and thickness so that it substantially prevents sticking of the first film layer 14 while not significantly interfering with the radiation sensitivity thereof. The second layer 15 is adhered to the first film layer 14 during use. If a water soluble formula is used, the second layer 15 is adhered to the first film layer 14 until the washout process that occurs after radiation exposure. During washout, layer 15 is dissolved away. If a water insoluble formula is used then layer 15 prematurely remains in contact to layer 14. Since layer 15 is the layer that will be glued to the article being blasted, it never is contacted with the etching abrasive and therefore will not disintegrate during use.

Typically the second layer 15 has a maximum thickness of about 0.0003 inches, depending upon the material of which it is made. While any material may be utilized for the second layer 15 that substantially prevents or minimizes sticking of the first film layer 14 to any other object or material (such as to the second face 13 of the substrate 11 of another laminate 10, or another portion of the laminate 10) while not significantly interfering with the radiation sensitivity of the first film layer 14, one particularly suitable material that may be utilized as the second layer 15 is a mixture of polyvinyl alcohol solution and polyvinyl acetate emulsion. The range may be 2–98% by weight of one and 98–2% of the other. If a water soluble formula is desired so as to facilitate washaway of the second layer during processing, preferably about 80%–98% by weight polyvinyl alcohol solution with the remainder polyvinyl acetate solution (and perhaps some inert materials is provided). If a substantially water insoluble formulation is desired it comprises about 80–98% by weight polyvinyl acetate solution with the remainder polyvinyl alcohol solution (and perhaps inert ingredients). One particular polyvinyl alcohol solution that may be utilized is AIRVOL 540, and one particular polyvinyl acetate emulsion is VINAC XX-240, both available from Air Products and Chemicals, Inc.

The second layer 15 is typically applied with a thickness of between about 0.0001–0.0002 inches, and may be applied by any conventional technique such as utilizing conventional direct roll coating processes, spraying, or the like. Because the second layer 15 is so thin, and is substantially radiation transparent, it cost effectively substantially eliminates or minimizes the sticking problem while not introducing another step for the utilization of the laminate 10, and while allowing normal utilization thereof to etch or abrade an object.

The laminate 10 may consist essentially of the substrate 11, first film layer 14, and second layer 15 or may comprise a wide variety of other layers for performing different functions. Another embodiment which includes an additional layer is illustrated schematically at 10' in FIG. 2. In FIG. 2 components comparable to those in FIG. 1 are shown by the same reference numeral.

In FIG. 2, the laminate 10' is shown with a membrane support layer 17, for example having a thickness of between about 3–5 microns and of any suitable material which would adhere to both the first surface 12 of the substrate 11 and the first film layer 14, is provided to operatively adhere the first film layer 14 to the substrate 11. The laminate 10' may consist essentially of the elements 1, 17, 14, and 15, or may comprise still further layers.

The laminate 10, 10' is illustrated schematically at 19 in FIG. 3 in roll form, with a corner of the leading edge 20 of the roll 19 curled back so as to clearly illustrate that the second layer 15 of one portion of the laminate 10, 10'; and the roll 19 engages the second face 13 of the substrate 11 of another portion of the roll 19, in a substantially non-stick manner which will allow utilization of the roll 19 even if stored for a relatively long period of time, and even in humid conditions.

FIG. 4 schematically illustrates a stack 22 of laminates 10, 10' in the form of sheets 23. While FIG. 4 shows the sheets 23 separated from each other, that is simply for clarity of illustration; in use the sheets 23 will engage each other stacked one above the other with the second layer 15 of one sheet engaging a second face 13 of the substrate 11 of an overlying or underlying sheet 23.

As described in copending application Ser. No. 09/137,702, the first film layer 14 may comprise two different clearly colored portions one atop of the other which may be removed (after exposure to UV radiation or the like) in the manner described in said copending application Ser. No. 09/137,702, or the laminates 10, 10' may be otherwise utilized in a method for making a stencil for abrading or etching using a negative acting or positive acting photoresist laminate 10, 10'. Typically the laminate 10, 10' is utilized by exposing the laminate 10, 10' in a conventional pattern to radiation (e.g. UV radiation) to cause hardening of some portions to define the pattern as a latent image in the photoresist film layer 14 by providing some portions that are soluble or dispersible in water, and other portions that are substantially insoluble or non-dispersible. The second layer 15 is of a thickness and material so that it does not significantly interfere with the passage of the effective radiation (e.g. UV) into contact with the first film layer 14, nor interfere with the formation of the latent image therein.

The method is continued by processing the laminate after exposure to radiation, as described above, by spraying water on the laminate to remove the soluble or dispersible portions of the first layer 14 and at least those portions of the second layer 15 covering the soluble or dispersible portions of the first layer 14, but not the substantially insoluble or non-dispersible portions of the first layer 14, to ultimately produce a stencil. Typically because of the thinness of the material of which the second layer 15 is formed, it will be completely removed during the spraying process, particularly if of a water soluble composition.

It will thus be seen that according to the present invention a photoresist laminate is provided, as well as a method of utilization thereof, and a stencil formed therefrom, which substantially eliminates or minimizes the sticking problem of the photoresist material that is inherent in conventional laminates. It does so in a manner that does not require a separate removable sheet, and does not complicate the method of utilization of the laminate, and in a cost effective manner.

While the invention has been herein shown and described in what is presently conceived to be the most practical and preferred embodiment thereof it will be apparent to those of ordinary skill in the art that may modifications may be made thereof within the scope of the invention, which scope is to be accorded the broadest interpretation of the appended claims so as to encompass all equivalent products and procedures.

What is claimed is:

1. A photoresist laminate comprising:

a substrate having first and second faces;

a first film layer of radiation sensitive material which is soluble or dispersible in water but will harden upon sufficient exposure to radiation so a to become substantially insoluble or non-dispersible, and operatively disposed on said substrate first face;

a second layer of a material and thickness so that it substantially prevents or minimizes sticking of said first film layer to other photoresist laminates while not significantly interfering with the radiation sensitivity thereof;

said second layer on the opposite side of said first film layer from said substrate;

a membrane support layer between and adhering to said substrate and said first film layer and engaging both said substrate and said first film layer; and wherein said first film layer has a thickness of about 0.002–0.009 inches, said substrate has a thickness of about 0.002–0.003 inches, and said second layer has a thickness of about 0.0001–[0.0002] *0.0005* inches.

2. A photoresist laminate as recited in claim 1 wherein said second layer comprises a mixture of about 80–98% by weight polyvinyl alcohol solution and about 20–2% by weight polyvinyl acetate emulsion.

3. A photoresist laminate as recited in claim 1 wherein said laminate is in sheet form, and stacked with other substantially identical laminates so that said second layer of one sheet engages said second face of said substrate of another sheet.

4. A photoresist laminate as recited in claim 1 wherein said first film layer comprises two clearly different color portions one atop the other.

* * * * *